US008898529B2

(12) United States Patent
Goessel et al.

(10) Patent No.: US 8,898,529 B2
(45) Date of Patent: Nov. 25, 2014

(54) HIGH PERFORMANCE COMPACTION FOR TEST RESPONSES WITH MANY UNKNOWNS

(75) Inventors: Michael Goessel, Mahlow (DE); Michael Richter, Berlin (DE); Thomas Rabenalt, Potsdam (DE)

(73) Assignee: Universität Potsdam (DE)

( * ) Notice: Subject to any disclaimer, the term of this patent is extended or adjusted under 35 U.S.C. 154(b) by 137 days.

(21) Appl. No.: 13/643,107

(22) PCT Filed: May 18, 2011

(86) PCT No.: PCT/EP2011/002475
§ 371 (c)(1),
(2), (4) Date: Oct. 24, 2012

(87) PCT Pub. No.: WO2011/144331
PCT Pub. Date: Nov. 24, 2011

(65) Prior Publication Data
US 2013/0173979 A1    Jul. 4, 2013

Related U.S. Application Data

(60) Provisional application No. 61/346,169, filed on May 19, 2010.

(51) Int. Cl.
*G01R 31/28* (2006.01)
*G01R 31/3177* (2006.01)
*G01R 31/3185* (2006.01)

(52) U.S. Cl.
CPC .... *G01R 31/3177* (2013.01); *G01R 31/318563* (2013.01); *G01R 31/318583* (2013.01); *G01R 31/318547* (2013.01)

USPC .............. 714/729; 716/50; 716/111; 714/733

(58) Field of Classification Search
CPC .................. G01R 31/3177; G01R 31/318547; G01R 31/318563; G01R 31/318544; G01R 31/318583; G01R 31/318335
USPC ............ 714/726, 727, 728, 729, 733; 716/50, 716/111, 136
See application file for complete search history.

(56) References Cited

U.S. PATENT DOCUMENTS 7,155,648 B2 * 12/2006 Jas et al. ...................... 714/726
7,412,637 B2 *  8/2008 Wang et al. .................. 714/729
7,752,515 B2 *  7/2010 Dervisoglu et al. .......... 714/728

(Continued)

OTHER PUBLICATIONS

Rabenalt, Thomas et al.: Masking of x-values by use of a hierarchically configurable register, Test Symposium, 2009, 14th IEEE European, May 25, 2009, pp. 149-154.

(Continued)

*Primary Examiner* — Cynthia Britt
(74) *Attorney, Agent, or Firm* — Schmeiser, Olsen & Watts, LLP

(57) ABSTRACT

A circuit arrangement for controlling the masking of test and diagnosis data with X values of an electronic circuit with N scan paths, wherein the test data are provided on insertion into the N scan paths by a decompressor with m inputs and N outputs (m<N) and wherein the masked test data are compacted by a compactor with N data inputs and n data outputs and m<N applies is provided.

5 Claims, 10 Drawing Sheets

(56) References Cited

U.S. PATENT DOCUMENTS

| | | | |
|---|---|---|---|
| 7,818,644 B2* | 10/2010 | Rajski et al. | 714/732 |
| 8,645,780 B2* | 2/2014 | Wohl et al. | 714/732 |
| 2007/0067688 A1 | 3/2007 | Vranken et al. | |
| 2009/0300446 A1 | 12/2009 | Rajski et al. | |
| 2010/0090706 A1 | 4/2010 | Malach et al. | |
| 2011/0307750 A1* | 12/2011 | Narayanan et al. | 714/729 |

OTHER PUBLICATIONS

International Search Report; PCT/EP2011/002475; Int'l File Date: May 18, 2011; Universitaet Potsdam, 3 pages.

M. Bushnell and V. D. Agrawal, "Essentials of electronic testing for digital, memory and mixed-signal VLSI circuits", Kluwer Academic Publishers, 0-7923-79991-8, 2000.

F.-U. Faber, M. Beck, M. Rudack, et al., "Doubling Test Cell Throughput by On-Loadboard Hardware—Implementation and Experience in a Production Environment", Conference Proceedings ETS, pp. 39-44, 2009.

S. Mitra, Kee Sup Kim, "X-compact: an efficient response compaction technique for test cost reduction", Proceedings ITC, pp. 311-320, 2002.

N. A. Touba, "X-canceling MISR—An X-tolerant methodology for compacting output responses with unknowns using a MISR", Proceedings ITC, Paper 6.2, 2007.

Chao, M.C.T. and Wang, Seongmoon and Chakradhar, S.T. and Cheng, Kwang-Ting, "ChiYun compact: a novel test compaction technique for responses with unknown values", Proceedings ITC, pp. 147-152, 2005.

Chen Wang and Reddy, S.M. and Pomeranz, I. and Rajski, J. And Tyszer, J., "On compacting test response data containing unknown values", Computer Aided Design, International Conference, pp. 855-862.

Manish Sharma, Wu-Tung Cheng, "Xfilter: filtering unknowns from compacted test responses", Proceedings ITC, Paper 42.1, 2005.

S. Wichlund and E. J. Aas, "Reducing Scan Test Data Volume and Time: A Diagnosis Friendly Finite Memory Compactor", 15th Asian Test Symposium (ATS'06), pp. 421-430, 2006.

Chao, M.C.-T. and Wang, Seongmoon and Chakradhar, S.T. and Cheng, Kwang-Ting, "Response shaper: a novel technique to enhance unknown tolerance for output response compaction", Proc. ICCAD-2005 Computer-Aided Design, pp. 80-87, 2005.

A. Chandra, Y. Kanazwa and R. Kapur, "Proactive Management of X's in Scan Chains for Compression", Proceedings of 10th Int'l Symposium on Quality Electronic Design, pp. 260-265, 2009.

J. Rajski, J. Tyszer, M. Kassab, et al., "Embedded deterministic test for low cost manufacturing test", Proceedings ITC, pp. 301-310, 2002.

Huaxing Tang and Chen Wang and Rajski, J. and Reddy, S.M. and Tyszer, J. and Pomeranz, I., "On efficient Xhandling using a selective compaction scheme to achieve high test response compaction ratios", 18th International Conference on VLSI Design, pp. 59-64, 2005.

V. Chickermane, B. Foutz, B. Keller, "Channel masking synthesis for efficient on-chip test compression", Proceedings ITC, pp. 452-461, 2004.

Wang, Seongmoon and Wei, Wenlong, "An Efficient Unknown Blocking Scheme for Low Control Data Volume and High Observability", IEEE Transactions on Computer-Aided Design of Integrated Circuits and Systems, vol. 27, pp. 2039-2052, 2008.

S. Wang, K. J. Balakrishnan, W. Wei, "X-Block: An Efficient LFSR Reseeding—Based Method to Block Unknowns for Temporal Compators", IEEE Trans. on Computers, vol. 57, No. 7, pp. 978-989, 2008.

P. Wohl, J. A. Waicukauski, S. Patel, M. B. Amin, "X-tolerant compression and application of scan-atpg patterns in a BIST architecture", Proceedings ITC, pp. 727-736, 2003.

P. Wohl, J. A. Waicukauski, S. Patel, "Scalable Selector Architecture for XTolerant Deterministic BIST", Design Automation Conference, pp. 934-939, 2004.

E. Gizdarski, "Constructing Augmented Multimode Compactors", 26th IEEE VLSI Test Symposium, Proceedings of VLSI Test Symposium, pp. 29-34, 2008.

Leininger, A. and Fischer, M. and Richter, M. and Goessel, M., "Using timing flexibility of automatic test equipment to complement X-tolerant test compression techniques", Proc. IEEE International Test Conferenc, pp. 1-9, 2007.

Hilscher, M. and Braun, M. and Richter,M. and Leininger, A. and Gossel, M., "Accelerated Shift Registers for Xtolerant Test Data Compaction", 13th European Test Symposium, Conference Proceedings ETS, pp. 133-139, 2008.

Arnold, R. and Leininger, A., "Evaluating ATE-equipment for volume diagnosis", Proceedings ITC, paper 41.1, 2005.

Hoist, S. and Wunderlich, H.-J., "A diagnosis algorithm for extreme space compaction", Proc. Design, Automation & Test in Europe Conference & Exhibition, pp. 1355-1360, 2009.

H. Vranken, S. K. Goel, A. Glowatz, J. Schloeffel, F. Hapke, "Fault Detection and Diagnosis with Parity Trees for Space Compaction of Test Responses", Proc. oft the 43rd Design Automation Conference, DAC, pp. 1095-1098, 2006.

N. A. Touba, "Survey of Test Vector Compression Techniques", IEEE Design & Test of Computers, vol. 23, pp. 294-303, 2006.

* cited by examiner

HIGH PERFORMANCE COMPACTION FOR TEST RESPONSES WITH MANY UNKNOWNS

The present disclosure relates to technologies in the field of test response compaction.

BACKGROUND

Scan testing transforms the test of a sequential circuit into a combinatorial test problem. In conjunction with automated test pattern generation (ATPG) software, this allows to handle the ever increasing complexity of digital designs. However, test data volume continues to grow with the design's complexity. Moreover, new process technologies and materials which allow smaller feature sizes require more comprehensive tests covering a range of different fault models [1]. Today, test cost constitutes a significant part of the production cost, typically in the range of 10-20% [2].

To keep test time and automated test equipment's (ATE) memory requirements in check, test input stimuli as well as test response data are transferred in compressed form. The basic design of scan test with test compression is depicted in FIG. 1. With test compression, the ATE transfers compressed test stimuli to the device-under-test (DUT), where it is deflated by a decompressor circuitry. The scan-out data is likewise compacted by an on-chip compactor. This setup allows to feed a large number of short internal scan chains with only a limited number of external ATE channels. This is advantageous as a large number of (relatively) short scan chains reduces the number of scan shift cycles per pattern, thus reducing test time and test cost.

A major obstacle to efficient test response compaction are unknown values (x-values) captured by scan cells during test. If test responses with x-values are compacted, some of the outputs of the compactor may also take unknown values and the correctness of the compactor inputs cannot be verified at the compactor outputs. The presence of x-values hence reduces observability of (non-x) scan cells which may lead to reduced test quality and/or limited compaction rates.

To overcome these problems a number of ideas have been proposed. Some compactors are designed to tolerate a limited number of x-values, e.g. [3], [4], [5], [6], [7], [8]. In general, however, these solutions are only applicable to designs with very low x-densities. A slightly different approach is taken in [9], [10], where scan out data is rearranged to reduce x-value impact before it is fed into the compactor.

A second approach is to mask the x-values before they enter the compactor [11], [12], [13], [14], [15]. These compactors require the transfer of additional masking data to the DUT. Furthermore, these concepts usually entail over-masking, i.e. the overall observability of scan cells is decreased. This may result in a lower probability to detect non-targeted faults.

Thirdly, output selection may be used to circumvent x-values [16], [17], [18]. Recently, the use of ATE timing flexibility to observe a subset of the output values of an accelerated compactor has been proposed [19], [20].

To further reduce test cost, circuits may be tested in parallel (multi-site testing). In that case, a number of DUTs shares the same input signals while transferring their test responses on separate channels each.

Furthermore, diagnosis data from volume testing is increasingly used for yield learning [21]. Hence, test compaction should also allow for efficient diagnosis. It has been demonstrated that test output data compacted into a single, 1-bit-wide output stream by an XOR-tree can be efficiently used for fault detection and diagnosis [22], [23]. However, these works considered x-free circuits only.

SUMMARY

A compaction solution is presented which allows an extreme response compaction (down to a single output) in presence of a high number of x-values. The solution is well suited for multi-site testing, can benefit from ATE timing flexibility, is design-independent and easily scales to an arbitrary number of scan chains.

According to one aspect of the invention, a circuit arrangement for controlling the masking of test and diagnosis data with X values of an electronic circuit with N scan paths is provided, wherein the test data are provided on insertion into the N scan paths by a decompressor with m inputs and N outputs, wherein m is <N and wherein the masked test data are compacted by a compactor with N data inputs and n data outputs and m<N applies, the arrangement comprising:

a first circuit component for masking the test data, which comprises N data inputs for input of N-digit binary unmasked test data, N control inputs for input of the binary control signals for masking the corresponding digits of the test data and N outputs for outputting the values of the masked test data bits corresponding to the control signals, a further circuit component with N binary inputs and N binary outputs for providing control signals, such that the N binary outputs are connected to the N control inputs of the first circuit component and wherein the first circuit component has a first serially loadable register with N memory elements, a second loadable register with likewise N memory elements for storing test pattern-dependent masking data and a third serially loadable register likewise with N memory elements for storing test-dependent masking data, wherein the following applies:

the input of the ith memory element of the second register is connected, for $i=1, \ldots, N$, logically directly with the ith input terminal of the further circuit component, if a first binary value is stored in the ith memory element, the input of the ith memory element of the second register is connected, for $i=2, \ldots, N$, with the output of the (i−1)th memory element of the second register, if a value is stored in the ith memory element of the first register which is different from the first binary value, the output of the jth memory element of the second register is connected, for $j=1, \ldots, N-1$, logically directly with the input of the (j+k)th memory element of this register, if the binary values b, b, ..., b, −b are stored in the jth, (j+1)th, ..., (j+k−1)th memory element of the third register, and for $k=1, \ldots, N$ the output of the kth memory element of the second register is connected with the first input in each case of a kth logic gate with two inputs and one output, of which the second input is connected with the output of the kth memory element of the third register, wherein the output of the kth gate with two inputs and one output conveys the kth binary digit of the masking signal and is connected with the kth control input of the first circuit component, and wherein the logic gate with two inputs and one output in each case has a controlling value.

According to another aspect of the invention, a circuit arrangement for an electrical circuit to be tested is provided, the arrangement comprising:

a test input signal generator, which generates a test input signal of width N, wherein only g<N bits of the test input signal may be released per cycle, terminals for connection to inputs and outputs of an electronic circuit to be tested, wherein the electronic circuit to be tested has N digital test inputs and M digital test outputs and wherein the terminals for the test inputs are connected to the test input signal and wherein the electronic circuit to be tested is controlled such that it outputs test responses at its test outputs, a circuit component with M inputs and m outputs (M>m) is present for compacting data, a circuit component for masking X values, comprising the sub-components masking logic, mask register and loading circuit, wherein as a function of the state of the mask register, the masking logic is configured to allow masking of a portion of the outputs of the circuit to be tested the mask register comprises one or more dynamically shortenable shift registers, whose state may be specified at least in part by way of the loading circuit the loading circuit specifies one or more inputs for the mask register data, such that a freely selectable portion of the M outputs of the circuit to be tested form the data inputs of the mask register.

According to a preferred embodiment of the invention, the loading circuit is connected directly to at least one output of the test input signal generator.

In a preferred embodiment, the dynamically shortenable mask register comprises memory elements, which at least in part provide the masking information for the masking logic and which are connected to from as a whole a shift register, each memory element is configured to store one mask bit, at least one memory element i is configured to be excluded from the shift chain, i.e. that the initial value of the preceding element i−1 is forwarded combinatorially to the input of the following memory element i+1, the loading circuit consists of a series of memory elements $IR_j$ and multiplexers $MUX1_j$, the output of the memory element $IR_j$ is connected to the input of the memory element $IR_{j+1}$ and the control input of the multiplexer $MUX1_j$, and one data input of the multiplexer $MUX1_j$ is connected to the data output of a memory element k of the dynamically shortenable mask register and the other input is connected to a signal from the signal cluster and the output of the multiplexer $MUX1_j$ is connected to the data input of the subsequent memory element k+1 in the mask register.

In still a further embodiment, the loading circuit and the dynamically shortenable shift register jointly consist of modules, the modules comprises memory elements $IR_i$, $MR_i$, $Cr_i$, multiplexers $MUX1_i$, $MUX2_i$, and an AND gate, and the components are connected as follows: the memory element with the data input controls with its data output the multiplexer, the multiplexer allows the data signal or the data signal to pass to its output, which is connected with the input of the memory element and one input of the multiplexer, the output of the memory element is connected to the second input of the multiplexer and one input of the AND gate, the output of the multiplexer is the line, the output of the memory element with the input is connected to the second input of the AND gate and control input of the multiplexer, the line is the output of the AND gate, and wherein the lines form the inputs of the module and the lines form the outputs of the module, and wherein the loading and mask register logic are formed by chaining these modules, wherein output of a module i is connected with in each case the input of the module i+1 and wherein the input is connected with a signal from the signal cluster and the output is connected with the X masking logic via signal cluster.

BRIEF DESCRIPTION

DETAILED DESCRIPTION

Following the invention will be described in further detail, by way of example, with reference to different embodiments.

The XHCMR-Compactor

Figure 2:
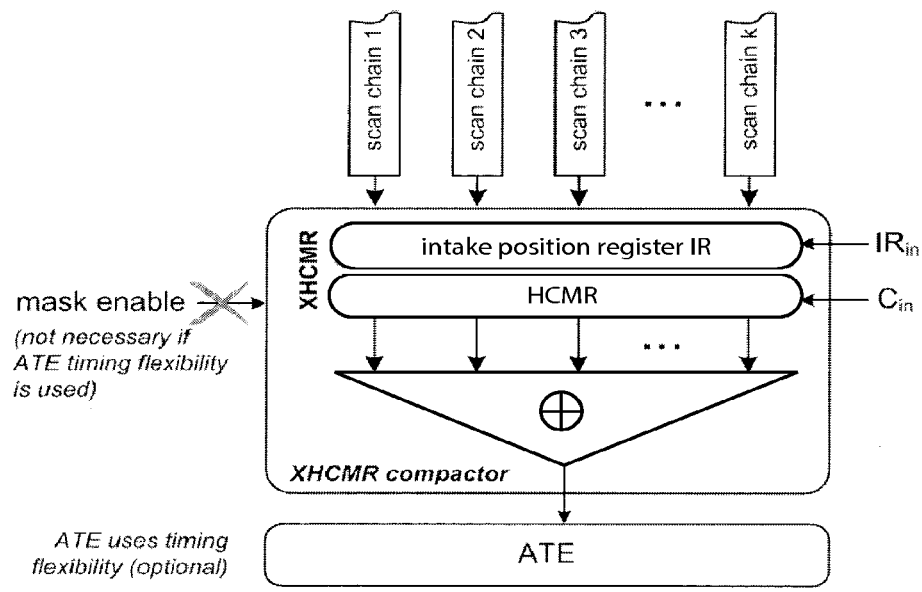
FIG. 2 depicts an embodiment of outputs of scan chains filtered through a novel x-masking logic and subsequently compacted into a single, one-bit wide bitstream by an XOR-tree.

In the proposed compactor the outputs of the scan chains are filtered through a novel x-masking logic and subsequently compacted into a single, 1-bit wide bitstream by an XOR-tree (FIG. 2). The masking logic allows to define arbitrary, pattern-specific masks for filtering x-values and provides an efficient mechanism for the loading of x-masking information.

The x-masking is performed in the eXtended Hierarchically Configurable Mark Register (XHCMR). At the beginning of the test, the XHCMR is initialized once by loading two k-bit words (k denoting the number of scan chains) via $IR_{in}$ and $C_{in}$ (cf. Section II.1 and II.2).

During test, pattern-specific, reduced masking data can be loaded in parallel using the scan chains. An explicit mask-enable signal determines the clock cycles in which x-masking is to be performed. If ATE timing flexibility is used, the need for the mask control signal is eliminated (cf. Section 0). In the following three subsections we introduce the proposed XHCMR compactor in detail. Firstly, we illustrate advantages of using a hierarchical masking logic to reduce masking data volume, then we describe a novel approach to load the (reduced) masking data in parallel using the scan chains of the DUT. In the last subsection, we discuss options to utilize ATE timing flexibility.

Reducing Masking Data

The masking logic is employed to mask x-values captured by scan cells with arbitrary, pattern-specific masks. In known approaches [13], each mask defines for each scan chain whether this chain is to be masked, hence, the length of the x-mask is equal to the total number of scan chains. However, the majority of scan chains never capture any x-values. Therefore, masking data can be reduced if masking information is only loaded for those chains which are affected by x-values during one or more patterns.

For that reason, the XHCMR compactor employs a hierarchically configurable mask register (HCMR) [24], which configures the masks in two stages. At the beginning of the test, the subset of all the scan chains which potentially need to be masked is selected (first stage). Subsequently, to create a pattern-specific mask, only the masking information for the selected subset needs to be transferred.

To that end, a k bit word Zefining an arbitrary subset of l out of all k scan chains which can be masked during test is loaded into the HCMR via the input $C_{in}$. Usually, this subset contains all scan chains which capture x-values in at least one pattern. The remaining scan chains cannot (and, by definition, need not to) be masked.

The choice of l maskable scan chains configures the HCMR to form a virtual mask register of length l. The virtual mask register VMR stores the pattern-specific x-masks which determine the scan chains to be masked in the respective test pattern. Consequently, for loading a new masking pattern, only l (instead of k) bits have to be loaded into the VMR.

A mask enable signal allows a per-clock activation of the mask. This control line is not necessary if ATE timing flexibility is used (cf. section II.3).

Parallel Loading of Mask Data

The architecture of the HCMR as presented in [24] provides only for serial loading of the mask information. This increases the test time if the length l of the x-masks exceeds the number n of flip-flops of the longest scan chain. In that case, additional l-n cycles are needed per test pattern to finish loading of the masking information. In this section, we present a new solution using parallel inputs to speed-up the loading of the mask information and eliminate the need for a separate input channel to transfer the x-mask data.

Figure 1:
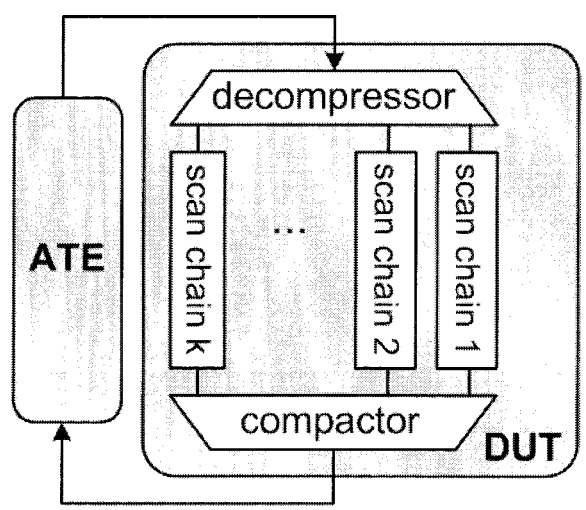
FIG. 1 depicts an embodiment of a design of scan test compression.

Ideally, the parallel loading mechanism should not require any additional data channels. For that reason, we propose to use the scan chains to feed the mask register. Even though there are k>l scan chains, these are usually fed by a decompressor (cf. FIG. 1). The decompressor limits the number of bits per slice whose values can be set independently of each other [25]. This number cannot exceed the number of decompressor inputs. To keep input bandwidth small, the number of decompressor inputs is usually only a fraction of the number of scan chains k, and also likely to be significantly smaller than the x-mask length l.

In the following, we assume that the values of g scan chains can be set independently of each other. Our solution uses g (g<<l) scan chains to load the mask information in parallel. This reduces the number of cycles required to load a mask to $$\left\lceil \frac{i}{g} \right\rceil$$

cycles.

To facilitate parallel loading, we divide the l-bit wide virtual mask register VMR into g segments $s_1, s_2, \ldots, s_g$ of (nearly) equal length. Each of these segments forms a separate shift register. The segments $s_1, s_2, \ldots, s_g$ are fed by a single scan chain each, which allows to feed them simultaneously. However, both the length and the flip-flops constituting the VMR depend on the subset of scan chains actually affected by x-values. Hence, the position and length of the segments $s_1, s_2, \ldots, s_g$ are unknown at design time. Therefore, it we cannot use a fixed set of scan chains to form the intakes of $s_1, s_2, \ldots, s_g$.

In the following, we describe the internal structure of the XHCMR which enables the dynamic positioning of the g intakes. This allows to create sections of equal length and thus provides for efficient parallel loading.

Figure 3:
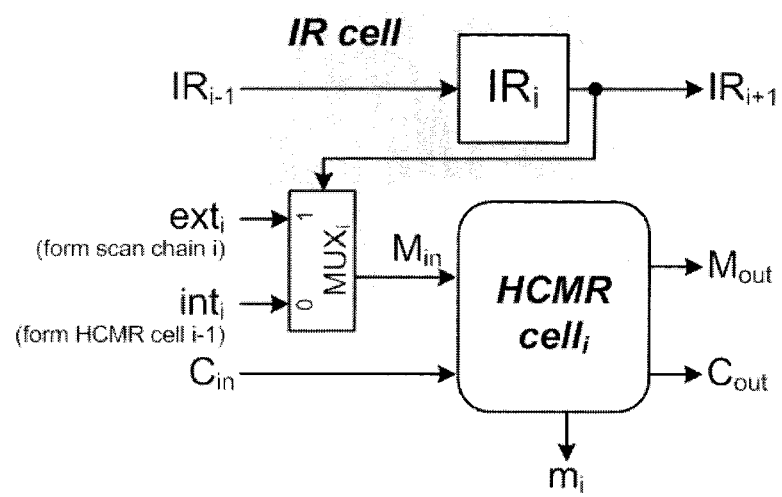
FIG. 3 depicts an XHCMR cell for a single scan chain.

FIG. 3 depicts an XHCMR cell for a single scan chain. The proposed structure consists of a standard HCMR cell [24] and an intake position register cell (IR cell) which defines the source for the input $M_{in}$ of the associated HCMR cell.

A HCMR cells stores all masking related information for a given scan chain. If the scan chain never captures x-values, the HCMR cell is configured to be transparent, i.e. its input $M_{in}$ is directly connected to its output $M_{out}$ and the corresponding scan chain is never masked ($m_i=0$). If, on the other hand, the scan chain may capture x-values, the HCMR cell is activated and acts like a flip-flop with the input $M_{in}$ and output $M_{out}$. Furthermore, value of the masking output $m_i$ is determined by the flip-flop's state. The HCMR (cf. FIG. 4) is made up by HCMR cells connected into a chain. It can thus be used to form a virtual mask register (VMR) by activating only a subset of its cells.

Figure 9:
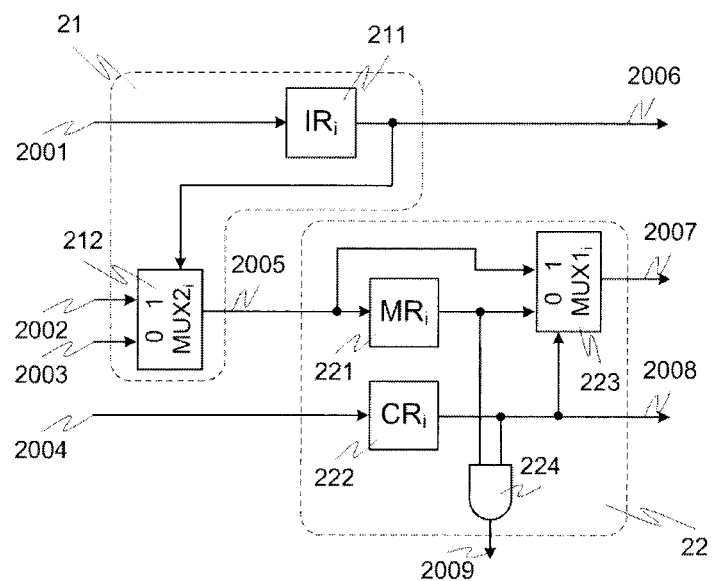
FIG. 9 depicts an embodiment of IR cells with additional multiplexers between the inputs respective outputs connecting successive HCMR cells.

To split the VMR into g segments, the IR cells add additional multiplexers $MUX_i$ ($0 \le i \le k$) between the inputs respective outputs connecting successive HCMR cells (cf. FIG. 3 and FIG. 9). Each $MUX_i$ is controlled by the corresponding flip-flop $IR_i$ and switches between the output $M_{out}$ of the preceding HCMR cell (equivalent to input $int_i$) and the external intake $ext_i$. If the value of the flip-flop $IR_i$ is 1, then the (external) source $ext_i$ is the input of the HCMR cell i. Thus, the VMR is splitted at this position and a new segment with a new external intake is created. If, on the other hand, $IR_i$ equals 0, then the HCMR cell i is directly connected to its predecessor (as in a standard HCMR). In this way, the standard HCMR can be dynamically divided into a number of shorter segments $s_1, s_2, \ldots, s_g$. By feeding the input $ext_i$ with the i-th scan chain, the segments can be loaded simultaneously through the scan chains.

The IR cells form a shift register, the intake position register IR, with the global input $IR_{in}$. The contents of the register IR thus defines the position of the intakes for parallel loading of the virtual mask register VMR. Like the subset of scan chains selected as maskable, the configuration of the IR remains unchanged during test.

Figure 4:
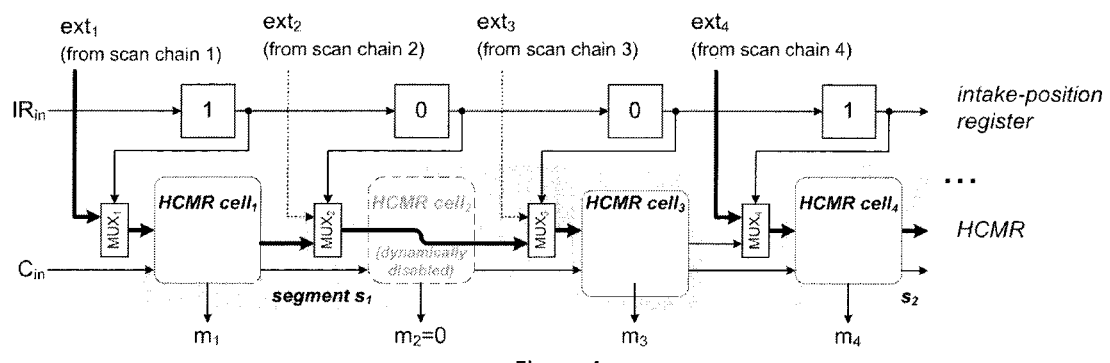
FIG. 4 depicts an embodiment of a 4-element XHCMR with a 3-bit virtual mask register.

FIG. 4 illustrates a 4-element XHCMR with a 3-bit virtual mask register VMR (formed by HCMR cells 1, 3 and 4). The configuration of the intake-position register divides the VMR into two separate segments $s_1$ and $s_2$ with the two intakes $ext_1$ and $ext_4$, respectively. Due to the selection of maskable scan chains and IR configuration, the first segment $s_1$ is made up of HCMR cell 1 and HCMR cell 3, while the second segment $s_2$ is made up by HCMR cell 4 only. HCMR cell 2 is in neither section (dynamically disabled) as the corresponding scan chain is not in the subset of maskable chains. In this example setup, the 3-bit mask can be loaded in only two clock cycles using $ext_1$ and $ext_4$.

Putting it all together, the overall test sequence using XHCMR can be summarized as follows:
(1) select virtual mask register elements (VMR) (k cycles)
(2) initialize intake position register (k cycles)
(3) load x-mask for patter P into VMR via scan chains (l/g cycles)
(4) scan-shift for pattern P (n≥1 cycles)
(5) if P<#pattern goto (3)

Compared to the basic HCMR architecture, reloading of the x-masks using XHCMR is reduced by the factor g.

The architecture from [24] and the XHCMR architecture were synthesized with the Synopsys Design Compiler (Version Z-2007.03-SP5) using the lsi_10k library. Table 1 displays area consumption per scan chain in NAND-equivalents. Compared to the HCMR, the XHCMR architecture reduces load time overhead and eliminates the need for an additional mask load channel with comparable per-cell area consumption.

TABLE 1

Comparison of HCMR-architecture and XHCMR architecture area (in NAND-equivalents)

| | HCMR cell (with shadow register (cf. [24])) | XHCMR cell |
|---|---|---|
| Combinational area | 6.0 | 8.0 |
| Non-combinational area | 25.0 | 27.0 |
| Total cell area | 31.0 | 35.0 |

Eliminating Control Signals Using Timing Flexibility

Modern automated test equipment (ATE) supports placement of several strobe positions within a single test cycle for a given channel. A practical solution using timing flexibility in conjunction with an accelerated compactor to reduce the impact of x-values was presented in [19], [20]. In this work, we propose to use the timing flexibility to eliminate the need for an explicit mask control signal.

In the standard approach, the mask enable signal is used to decide whether the current x-mask should be applied at the current test cycle. If the ATE timing flexibility is used, both the masked and the non-masked test response are provided during each scan-out cycle. The decision whether to apply the mask can then be transformed into the decision about the time in which the test response is strobed by the ATE. Hence, the mask enable signal is eliminated while the volume of test data to be evaluated on the ATE remains constant, thus increasing the overall compaction ratio.

Please note that a strobe position is stored on the ATE for each clock cycle and each pin irrespective of whether the strobe position is always the same or not. Hence, using multiple different strobe positions does not affect the strobe position data volume.

To provide both a masked and a non-masked test response within a single cycle, an internal mask enable signal is used. This internal signal is alternating between 0 and 1 with a period equal to a single scan shift cycle, which effectively means that the signal is equal to the scan clock signal.

By programming the strobe positions for each scan cycle, either the masked or non-masked compactor output can be evaluated by the ATE. As only two different strobe positions are required, this technique can be used on all current ATE models.

Figure 5:
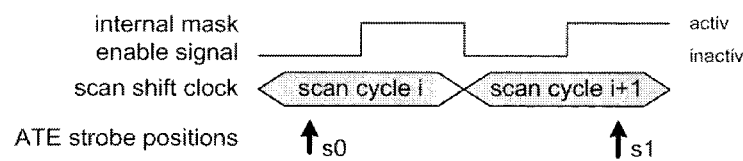
FIG. 5 depicts an embodiment of a selection of strobe positions within a scan cycle.

FIG. 5 displays the selection of strobe positions within a scan cycle. The internal mask enable signal activates the masking logic during the second half of each clock cycle. Correspondingly, two strobe positions s0 and s1 have to be defined on the ATE. If the masked test response is to be evaluated, strobing has to be performed at time s1. If a masking of the test response is not desired, strobing should be performed at s0. In FIG. 5, the test response in cycle i is evaluated without masking (strobed at s0), while in cycle i+1 the masked test response is evaluated (strobed at s1).

Improving Compaction Ratio Further
Multi-Site Testing

Multi-site testing aims at reducing test cost by testing multiple DUTs in parallel on a single ATE. The parallel testing increases the number of DUTs testable by a single ATE in a given time.

Figure 6:
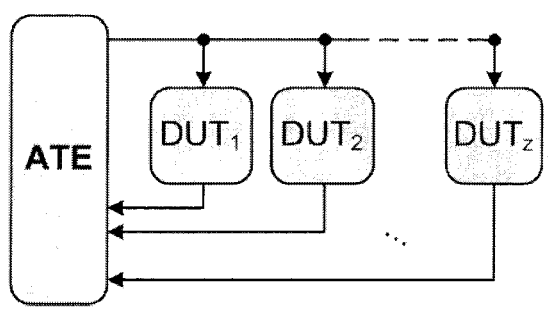
FIG. 6 depicts an embodiment of multiple DUTs in parallel on a single ATE.

All DUTs can share the same input signals (shared driver [2]), while output signals have to be individually transferred to and processed by the ATE to allow identification of failing chips. The power of multi-site testing stems from the fact that the sharing of input stimuli makes both test stimuli memory and the number of output channels on ATE independent of the number of DUTs tested (cf. FIG. 6). The feasibility of testing up to 8 DUTs in parallel on a low pin count ATE in a production environment was demonstrated in [2].

As the number of output channels of the ATE is independent of the number of DUTs tested, parallelism is limited by the number of input channels required to process the test responses of individual DUTs. For that reason, a solution suited for multi-site testing requires a low output pin count on each DUT, while the number of required input pins is of much less importance.

The proposed compactor solution requires only a single 1-bit wide tester channel to transfer the test responses to the ATE. The input channels providing the mask information and test stimuli can be shared. Thus, in multi-site testing the overall compaction ratio of the proposed compactor scales well with the number of DUTs tested in parallel (see experimental results).

Determining an Optimal Scan Chain Configuration

The overall compaction ratio of the XHCMR compactor is the ratio between uncompacted scan-out data and XHCMR compactor input and output data. If the number of scan chains is increased, the amount of output data is reduced as a higher compaction is achieved by the XOR-tree. On the other hand, input data increases, as more scan chains likely cause a longer virtual mask register (VMR). In this section, we present a formula that can be used to compute the optimal number of scan chains in a standard test set-up.

The overall compaction ratio r of the XHCMR compactor for single-site testing without ATE-timing flexibility can be calculated as $$r = (p \cdot k \cdot n)/(p \cdot n + 2k + p \cdot n + p \cdot l)) \quad (1)$$

where p is the number of test patterns, k is the number of scan chains, n is the number of flip-flops of the longest scan chain and l is the length of the virtual mask register VMR.

The number of scan chains k for which the maximum overall compaction ratio r is achieved can be computed based on (1). For the sake of simplicity we assume:
- All scan chain have (almost) the same length. Thus, the number c of scan-flip flops in the design is approximately $c = k \cdot n$.
- The length l of the VMR scales linearly with the total number of scan chains k, $m \cdot k$, with $0 \leq m \leq 1$.
- The reconfiguration of the scan chains does not affect the number of test patterns p. Transforming (1) using these assumptions we obtain $$r = \frac{p \cdot c}{2k + p\left(2 \cdot \frac{c}{k} + m \cdot k\right)} \quad (2)$$

Since the values of p, c and m are known (and constant) for a specific design, the nominator is also a constant; therefore, the compression ratio r increases if the denominator of equation (2) decreases.

To find the minimum of the denominator of equation (2) depending on the value of k, we compute the first and second derivative of the denominator d(k), denoted as d(k)' and d(k)" in equation (3) and (4):

$$d(k)' = mp - \frac{2cp}{k^2} + 2 \qquad (3)$$

$$d(k)'' = \frac{4cp}{k^3} \qquad (4)$$

Using the derivatives d(k)' and d(k)" it can be easily shown that equation (5) describes a minimum of d(k) if k>0. Thus, (5) can be used to calculate the number of scan chains for the proposed XHCMR compactor to maximize the compression ratio r.

$$k = \sqrt{\frac{2cp}{2+mp}} \qquad (5)$$

In a similar way, formulas to compute the optimal scan chain configuration taking ATE timing flexibility and/or multi-site testing into account can be derived.

Figure 7:
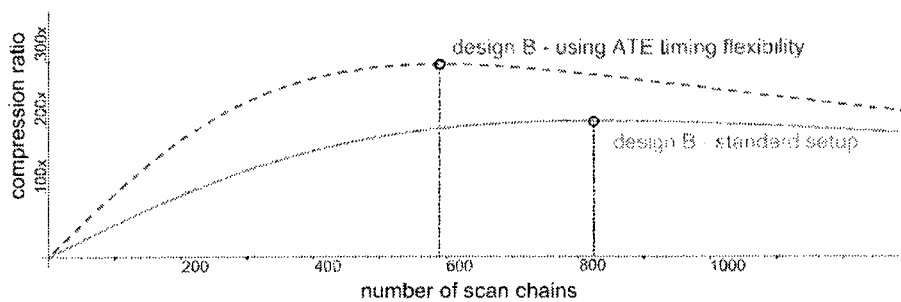
FIG. 7 depicts a compaction ratio r for design B (cf. Table 2) depending on the number of scan chains.

FIG. 7 illustrates the compaction ratio r for design B (cf. Table 2) depending on the number of scan chains. The solid line displays the compaction ratio for the standard test set-up with a maximum of 208x at k=833 scan chains. Thus, in this case an optimal scan chain configuration implements 833 scan chains of length ~125. The curve indicates a wide range of nearly maximal compression. For design B, a compression ratio ≥200 can be achieved with scan chain configurations ranging from 620 to 1100 scan chains, providing considerable flexibility for the test engineer.

Using ATE timing flexibility as presented in section 0, the compression ratio can be further improved peaking at k=589 scan chains with r=294x.

Methodology

To assess the effectiveness of the proposed compactor, its performance on three different industrial designs is investigated. For production test, all three designs use on-chip decompression/compaction provided by a commercial test suite. For our experiments, we used the circuits' original scan chain configuration. Instead of the original compactor, all scan chain outputs are compacted into a 1-bit stream by a XHCMR compactor. Fault coverage was determined by performing a full (stuck-at) fault simulation using the existing stuck-at test set tuned to the commercial test suite.

Two masking approaches were studied: full masking, which masks all x-values, and a second, less restrictive masking method, which we called smart masking. The idea of smart masking is that over-masking of output care bits can be reduced by not masking all x-values.

As output care bit information was not readily accessible, we used the fault simulator's ability to define any given line to be a virtual output to directly observe the scan cells' inputs. The care bit positions were then computed using this information in conjunction with the scan chain configuration data.

Masking information for smart masking was computed using a simple heuristic algorithm. The algorithm processes the patterns sequentially. For each pattern, the mask is initially empty and all yet undetected faults causing errors within that pattern are listed in arbitrary order in the fault queue. The first fault is retrieved from the fault queue. If it is detectable with the current mask, processing continues with the next fault. Otherwise, the mask is extended to allow detection of the fault effect of the considered fault in at least one output slice and the next fault is processed. This is repeated for all faults in the fault queue. While the extension of the mask may cause a masking of faults considered earlier, this heuristic works remarkably well (see experimental results).

The fault coverage was determined by resimulating the test set with the computed masking information. By using the test set actually employed in production testing (albeit with another compactor), fault detection is limited to faults detected by the predefined test set. On the other hand, our results give a realistic impression of the compactor's performance without customized tooling support. It seems likely that a customized ATPG algorithm tailored to the XHCMR compactor would further improve the fault detection rate and/or reduce pattern count.

Experimental Results

In this section, we investigate the performance of the proposed compactor with respect to overall scan cell observability and fault coverage. Basic information for the considered designs is given in table 2. The designs A and B have been presented in [24].

TABLE 2 basic design information

|  | design A | design B | design C |
|---|---|---|---|
| # scan flip-flops | 139,597 | 104,509 | 33,296 |
| # scan chains | 515 | 1,360 | 171 |
| longest scan chains | 295 | 82 | 198 |
| # test pattern | 503 | 9,188 | 5,654 |
| x-probability | 0.43% | 1.78% | 2.75% |
| # chains affected by x-values | 256 | 409 | 5,654 |

Table 3 summarizes the resulting overall compaction ratio r (cf. equation (1)) for the given designs using their original scan chain configuration. In standard test set-up (first row) the XHCMR compactor achieves compaction ratios up to 194x (design B) for the given industrial designs. Even for design C, which implements only a small number of scan chains, a compaction ratio of more than 70x is achieved.

Compression ratios can be further increased by using ATE timing flexibility and/or multi-site testing. Testing four DUTs in parallel, compression of up to 544x (design B) can be realized. If ATE timing flexibility is used in combination with 4x multi-site test, compaction ratios ranging from 155x (design C) to 605x (design B) are achieved (last row).

TABLE 3 comp. ratio r for different test setups with XHCMR compactor

| | compaction ratio r | | |
|---|---|---|---|
| test setup | design A | design B | design C |
| standard setup | 179.36x | 194.57x | 71.43x |
| ATE timing flexibility | 275.21x | 227.06x | 122.66x |
| MST 4 DUTs | 350.86x | 544.57x | 126.81x |
| MST4 DUTs + ATE timing flexibility | 422.89x | 605.14x | 155.66x |

In the first experiment we investigated the fraction of observable non-x-cells if all x-values are masked (full masking) using the XHCMR masking logic. A high observability of the scan cells indicates a high fault coverage for a given test set, as (both targeted and non-targeted) errors are then likely to be observed at the compactor's output.

TABLE 4 observable non-x scan cells using full x-masking

|  | design A | design B | design C |
|---|---|---|---|
| observable non-x cells | 91.78% | 93.30% | 91.89% |

For all three designs, the fraction of observable scan cells is high, ranging from 91.7% to 93.3% (cf. table 4), in spite of large compaction ratios (171-to-1 to 1360-to-1) and medium (1.78%) to high (2.75%) x-densities. Thus, x-masking has a low impact on the number of observable scan cells even if all x-values are masked during test.

In the second experiment, the fault coverage based on care bit information to investigate the test quality for design C was specifically measured. Using XHCMR with the original scan chain configuration, a compaction ratio of ~71x is achieved. Two masking approaches were used: full masking masks all x-values during test while smart masking (cf. section IV) is less restrictive. Depending on the masking approach, 99.5% and 99.8% of all faults (100% is equal to all faults covered by original test set (cf. section IV)) are detectable at the compactor output for full masking and smart masking, respectively.

Figure 8:
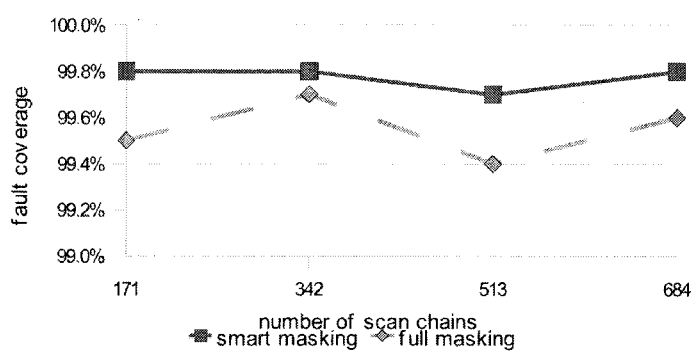
FIG. 8 depicts the resulting fault coverage for the considered number of scan chains.

To assess the impact of further increases of the compaction ratio, we also investigated the fault coverage for a higher number of scan chains. To that end, we rearranged the scan chains of design C to get 2, 3, and 4 times as many scan chains as in the original configuration. FIG. 8 depicts the resulting fault coverage for the considered number of scan chains. For both masking methods the fault coverage is very high and independent of the number of scan chains. This indicates that a scan chain configuration which maximizes compression ratio can be chosen without compromising test quality.

Figure 10:
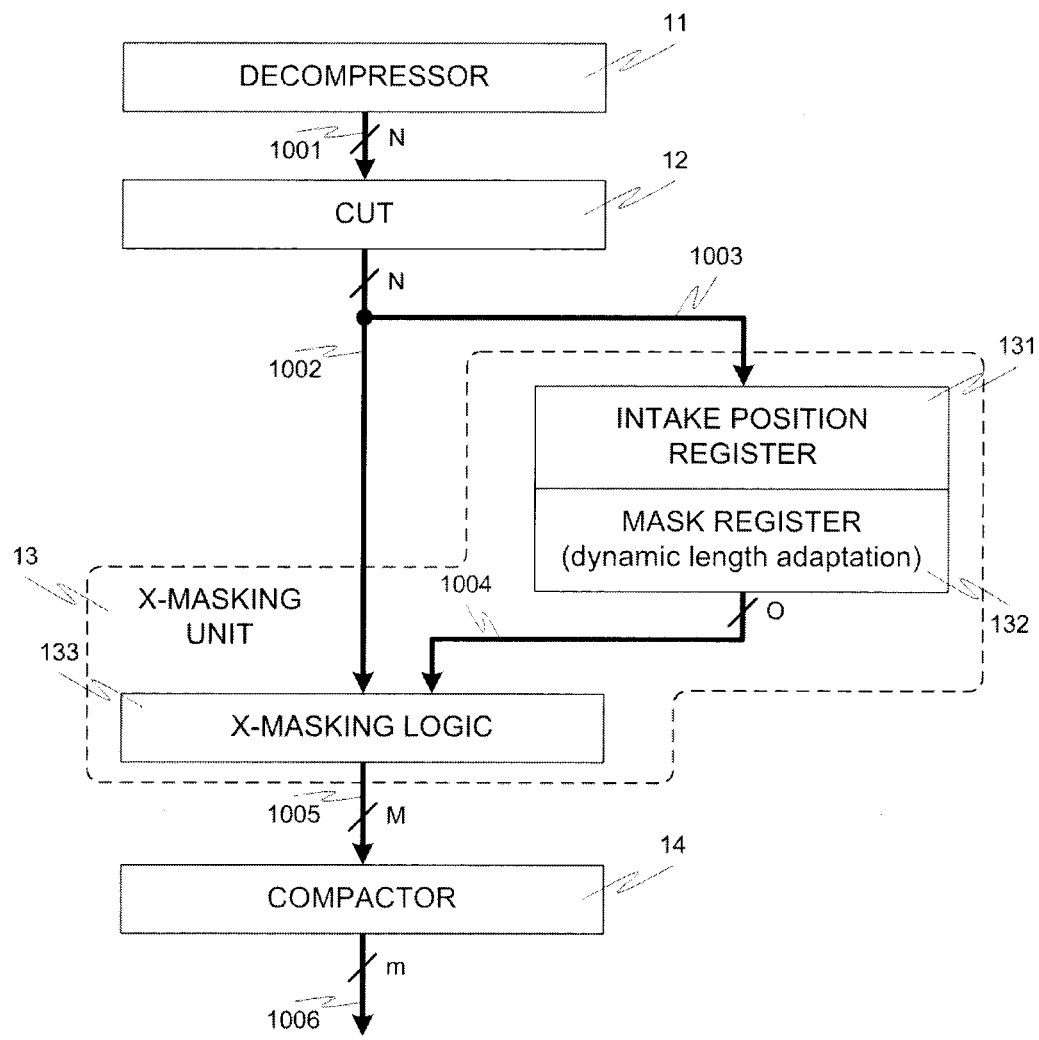
FIG. 10 depicts a flow chart in accordance with the present disclosure.

An example how the invention is included in the test architecture is given in FIG. 10.

A new compactor solution for very high compaction ratios (>200x) in presence of many x-values without compromising test quality was presented. This is accomplished by a highly effective x-masking register which only targets scan chains actually capturing x-values. The x-masking information can be loaded in parallel using the DUT's scan chains and built-in decompressor logic.

A novel technique uses ATE timing flexibility to eliminate the need for a mask control channel and increase the overall compaction ratio. The compactor architecture is design independent. Due to its regular structure, it can readily be implemented as a push-button solution.

The proposed single-output compactor is very well suited for multi-site testing, enabling compression ratios of ~500x in 4-DUT multi-site testing setups.

The features disclosed in this specification, claims and/or the figures may be material for the realization of the invention in its various embodiments, taken in isolation or in various combinations thereof.

REFERENCES

[1] M. Bushnell and V. D. Agrawal, "Essentials of electronic testing for digital, memory and mixed-signal VLSI circuits", Kluwer Academic Publishers, 0-7923-79991-8, 2000

[2] F.-U. Faber, M. Beck, M. Rudack, et al., "Doubling Test Cell Throughput by On-Loadboard Hardware—Implementation and Experience in a Production Environment", Conference Proceedings ETS, pp. 39-44, 2009

[3] S. Mitra, Kee Sup Kim, "X-compact: an efficient response compaction technique for test cost reduction", Proceedings ITC, pp. 311-320, 2002

[4] N. A. Touba, "X-canceling MISR—An X-tolerant methodology for compacting output responses with unknowns using a MISR", Proceedings ITC, Paper 6.2, 2007

[5] Chao, M. C. T. and Wang, Seongmoon and Chakradhar, S. T. and Cheng, Kwang-Ting, "ChiYun compact: a novel test compaction technique for responses with unknown values", Proceedings ITC, pp. 147-152, 2005

[6] Chen Wang and Reddy, S. M. and Pomeranz, I. and Rajski, J. and Tyszer, J., "On compacting test response data containing unknown values", Computer Aided Design, International Conference, pp. 855-862,

[7] Manish Sharma, Wu-Tung Cheng, "X-filter: filtering unknowns from compacted test responses", Proceedings ITC, Paper 42.1, 2005

[8] S. Wichlund and E. J. Aas, "Reducing Scan Test Data Volume and Time: A Diagnosis Friendly Finite Memory Compactor", 15th Asian Test Symposium (ATS'06), pp. 421-430, 2006

[9] Chao, M. C.-T. and Wang, Seongmoon and Chakradhar, S. T. and Cheng, Kwang-Ting, "Response shaper: a novel technique to enhance unknown tolerance for output response compaction", Proc. ICCAD-2005 Computer-Aided Design, pp. 80-87, 2005

[10] A. Chandra, Y. Kanazwa and R. Kapur, "Proactive Management of X's in Scan Chains for Compression", Proceedings of 10th Int'l Symposium on Quality Electronic Design, pp. 260-265, 2009

[11] J. Rajski, J. Tyszer, M. Kassab, et al., "Embedded deterministic test for low cost manufacturing test", Proceedings ITC, pp. 301-310, 2002

[12] Huaxing Tang and Chen Wang and Rajski, J. and Reddy, S. M. and Tyszer, J. and Pomeranz, I., "On efficient X-handling using a selective compaction scheme to achieve high test response compaction ratios", 18th International Conference on VLSI Design, pp. 59-64, 2005

[13] V. Chickermane, B. Foutz, B. Keller, "Channel masking synthesis for efficient on-chip test compression", Proceedings ITC, pp. 452-461, 2004

[14] Wang, Seongmoon and Wei, Wenlong, "An Efficient Unknown Blocking Scheme for Low Control Data Volume and High Observability", IEEE Transactions on Computer-Aided Design of Integrated Circuits and Systems, Vol. 27, pp. 2039-2052, 2008

[15] S. Wang, K. J. Balakrishnan, W. Wei, "X-Block: An Efficient LFSR Reseeding-Based Method to Block Unknowns for Temporal Compators", IEEE Trans. on Computers, vol. 57, no. 7, pp. 978-989, 2008

[16] P. Wohl, J. A. Waicukauski, S. Patel, M. B. Amin, "X-tolerant compression and application of scan-atpg patterns in a BIST architecture", Proceedings ITC, pp. 727-736, 2003

[17] P. Wohl, J. A. Waicukauski, S. Patel, "Scalable Selector Architecture for X-Tolerant Deterministic BIST", Design Automation Conference, pp. 934-939, 2004

[18] E. Gizdarski, "Constructing Augmented Multimode Compactors", Proceedings of VLSI Test Symposium, pp. 29-34, 2008

[19] Leininger, A. and Fischer, M. and Richter, M. and Goessel, M., "Using timing flexibility of automatic test equip-

[20] Hilscher, M. and Braun, M. and Richter, M. and Leininger, A. and Gossel, M., "Accelerated Shift Registers for X-tolerant Test Data Compaction", Conference Proceedings ETS, pp. 133-139, 2008

[21] Arnold, R. and Leininger, A., "Evaluating ATE-equipment for volume diagnosis", Proceedings ITC, paper 41.1, 2005

[22] Holst, S. and Wunderlich, H.-J., "A diagnosis algorithm for extreme space compaction", Proc. Design, Automation & Test in Europe Conference & Exhibition, pp. 1355-1360, 2009

[23] H. Vranken, S. K. Goel, A. Glowatz, J. Schloeffel, F. Hapke, "Fault Detection and Diagnosis with Parity Trees for Space Compaction of Test Responses", Proc. oft the 43rd Design Automation Conference, DAC, pp. 1095-1098, 2006

[24] T. Rabenalt, M. Goessel, A. Leininger, "Masking X-values by Use of a Hierarchically Configurable Register", Conference Proceedings ETS, pp. 149-154, 2009

[25] N. A. Touba, "Survey of Test Vector Compression Techniques", IEEE Design & Test of Computers, Vol. 23, pp. 294-303, 2006

The invention claimed is:

1. A circuit arrangement for controlling a masking of test and diagnosis data with X values of an electronic circuit with N scan paths, wherein the test data are provided on insertion into the N scan paths by a decompressor with m inputs and N outputs, wherein m is <N and wherein the masked test data are compacted by a compactor with N data inputs and n data outputs and m<N applies, the circuit arrangement comprising:

a first circuit component for masking the test data, which comprises N data inputs for input of N-digit binary unmasked test data, N control inputs for input of the binary control signals for masking the corresponding digits of the test data and N outputs for outputting the values of the masked test data bits corresponding to the control signals; and a second circuit component with N binary inputs and N binary outputs for providing control signals, such that the N binary outputs are connected to the N control inputs of the first circuit component and wherein the first circuit component has a first serially loadable register with N memory elements, a second loadable register with likewise N memory elements for storing test pattern-dependent masking data and a third serially loadable register likewise with N memory elements for storing test-dependent masking data, wherein the following applies:

the input of the ith memory element of the second register is connected, for i=1, ..., N, logically directly with the ith input terminal of the second circuit component, if a first binary value is stored in the ith memory element, the input of the ith memory element of the second register is connected, for i=2, ..., N, with the output of the (i−1)th memory element of the second register, if a value is stored in the ith memory element of the first register which is different from the first binary value, the output of the jth memory element of the second register is connected, for j=1, ..., N−1, logically directly with the input of the (j+k)th memory element of this register, if the binary values b, b, ..., b, −b are stored in the jth, (j+1)th, ..., (j+k−1)th memory element of the third register, and for k=1, ..., N the output of the kth memory element of the second register is connected with the first input in each case of a kth logic gate with two inputs and one output, of which the second input is connected with the output of the kth memory element of the third register, wherein the output of the kth gate with two inputs and one output conveys the kth binary digit of the masking signal and is connected with the kth control input of the first circuit component, and wherein the logic gate with two inputs and one output in each case has a controlling value.

2. A circuit arrangement for an electrical circuit to be tested, comprising:

a test input signal generator, which generates a test input signal of width N, wherein only g<N bits of the test input signal may be released per cycle;

a plurality of terminals for connection to inputs and outputs of an electronic circuit to be tested, wherein the electronic circuit to be tested has N digital test inputs and M digital test outputs and wherein the terminals for the test inputs are connected to the test input signal and wherein the electronic circuit to be tested is controlled such that it outputs test responses at its test outputs;

a first circuit component with M inputs and m outputs (M>m) is present for compacting data;

a second circuit component for masking X values, comprising the sub-components masking logic, mask register and loading circuit, wherein as a function of the state of the mask register, the masking logic is configured to allow masking of a portion of the outputs of the circuit to be tested, the mask register comprises one or more dynamically shortenable shift registers, whose state is specified at least in part by way of the loading circuit, and the loading circuit specifies one or more inputs for the mask register data, such that a freely selectable portion of the M outputs of the circuit to be tested form the data inputs of the mask register.

3. The arrangement according to claim 2, wherein the loading circuit is connected directly to at least one output of the test input signal generator.

4. The arrangement according to claim 2, wherein the dynamically shortenable mask register comprises memory elements, which at least in part provide the masking information for the masking logic and which are connected to from as a whole a shift register, each memory element is configured to store one mask bit, at least one memory element i is configured to be excluded from the shift chain, such that the initial value of the preceding element i−1 is forwarded combinatorially to the input of the following memory element i+1, the loading circuit consists of a series of memory elements $IR_j$ and multiplexers $MUX1_j$, the output of the memory element $IR_j$ is connected to the input of the memory element $IR_{j+1}$ and the control input of the multiplexer $MUX1_j$, and one data input of the multiplexer $MUX1_j$ is connected to the data output of a memory element k of the dynamically shortenable mask register and the other input is connected to a signal from the signal cluster and the output of the multiplexer $MUX1_j$ is connected to the data input of the subsequent memory element k+1 in the mask register.

5. The arrangement according to claim 2, wherein
the loading circuit and the dynamically shortenable shift register jointly consist of modules,
the modules comprises memory elements $IR_i$, $MR_i$(221), $Cr_i$, multiplexers $MUX1_i$, $MUX2_i$, and an AND gate, and
the components are connected as follows:
- the memory element with the data input controls with its data output the multiplexer,
- the multiplexer allows the data signal or the data signal to pass to its output, which is connected with the input of the memory element and one input of the multiplexer,
- the output of the memory element is connected to the second input of the multiplexer and one input of the AND gate,
- the output of the multiplexer is the line,
- the output of the memory element with the input is connected to the second input of the AND gate and control input of the multiplexer,
- the line is the output of the AND gate,
- and wherein the lines (2001-2004) form the inputs of the module and the lines (2006-2009) form the outputs of the module,
- and wherein the loading and mask register logic are formed by chaining these modules, wherein output of a module i is connected with in each case the input of the module i+1 and wherein the input is connected with a signal from the signal cluster and the output is connected with the X masking logic via signal cluster.

\* \* \* \* \*

UNITED STATES PATENT AND TRADEMARK OFFICE
CERTIFICATE OF CORRECTION

PATENT NO. : 8,898,529 B2
APPLICATION NO. : 13/643107
DATED : November 25, 2014
INVENTOR(S) : Michael Goessel, Michael Richter and Thomas Rabenalt It is certified that error appears in the above-identified patent and that said Letters Patent is hereby corrected as shown below:

In the Specification

In Column 5, Line 55, replace the [i/g] with [l/g].

In Column 6, Line 25, replace the "," after "MUX" with a subscript "i" ($MUX_i$).

In the Claims

In Claim 4, Column 14 Line 50, the word "from" needs to be replaced with the word "form.".

Signed and Sealed this
Twenty-eighth Day of July, 2015

Michelle K. Lee
*Director of the United States Patent and Trademark Office*